(12) United States Patent
Wang

(10) Patent No.: US 11,138,948 B2
(45) Date of Patent: Oct. 5, 2021

(54) VOLTAGE STABILIZATION CIRCUIT, CONTROL METHOD, AND DISPLAY DEVICE

(71) Applicant: TCL China Star Optoelectronics Technology Co., Ltd., Shenzhen (CN)

(72) Inventor: Tianhong Wang, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 68 days.

(21) Appl. No.: 16/623,768

(22) PCT Filed: Dec. 3, 2019

(86) PCT No.: PCT/CN2019/122526
§ 371 (c)(1),
(2) Date: Dec. 18, 2019

(87) PCT Pub. No.: WO2020/220673
PCT Pub. Date: Nov. 5, 2020

(65) Prior Publication Data
US 2021/0210043 A1      Jul. 8, 2021

(30) Foreign Application Priority Data

Apr. 29, 2019   (CN) .......................... 201910354788.9

(51) Int. Cl.
*G09G 3/36*      (2006.01)
(52) U.S. Cl.
CPC ......... *G09G 3/3696* (2013.01); *G09G 3/3677* (2013.01); *G09G 2300/0408* (2013.01); *G09G 2330/021* (2013.01)

(58) Field of Classification Search
CPC combination set(s) only.
See application file for complete search history.

(56) References Cited

U.S. PATENT DOCUMENTS

| 8,482,496 | B2 * | 7/2013 | Lewis | ................... G09G 3/3466 |
| | | | | 345/84 |
| 2006/0267973 | A1 * | 11/2006 | Woo | ....................... H02M 3/158 |
| | | | | 345/211 |

(Continued)

FOREIGN PATENT DOCUMENTS

| CN | 105304047 | 2/2016 |
| CN | 107424577 | 12/2017 |
| CN | 107731186 | 2/2018 |

*Primary Examiner* — Van N Chow

(57) ABSTRACT

A voltage stabilization circuit, a control method, and a display device are provided. The circuit includes first transistor, second transistor, and third transistor. A source of the first transistor is electrically connected to a drain of the second transistor and a gate of the third transistor, a drain of the first transistor is electrically connected to a first control output terminal of a power management integrated circuit, a gate of the first transistor is electrically connected to a second control output terminal of the power management integrated circuit, a gate of the second transistor is electrically connected to the second control output terminal of the power management integrated circuit, and a drain of the third transistor is electrically connected to a first level terminal for connecting to a display panel. This solves issues of VSSG potential drift caused by transistor aging and further guarantees normal operation of the display panel.

9 Claims, 4 Drawing Sheets

(56) References Cited

U.S. PATENT DOCUMENTS

| | | | |
|---|---|---|---|
| 2006/0284864 A1* | 12/2006 | Woo | G09G 3/00 |
| | | | 345/211 |
| 2008/0290940 A1* | 11/2008 | Scuteri | H03F 3/45475 |
| | | | 330/253 |
| 2019/0057668 A1 | 2/2019 | Xiong et al. | |
| 2019/0066613 A1* | 2/2019 | Chen | G09G 3/3655 |
| 2019/0130865 A1 | 5/2019 | Xiong et al. | |
| 2020/0187328 A1* | 6/2020 | Chen | H05B 45/46 |

* cited by examiner

VOLTAGE STABILIZATION CIRCUIT, CONTROL METHOD, AND DISPLAY DEVICE

RELATED APPLICATIONS

This application is a National Phase of PCT Patent Application No. PCT/CN2019/122526 having International filing date of Dec. 3, 2019, which claims the benefit of priority of Chinese Patent Application No. 201910354788.9 filed on Apr. 29, 2019. The contents of the above applications are all incorporated by reference as if fully set forth herein in their entirety.

FIELD AND BACKGROUND OF THE INVENTION

The present disclosure relates to the field of display circuit voltage stabilization technologies, and more particularly to a voltage stabilization circuit, a control method, and a display device.

Flat display devices such as liquid crystal displays (LCDs) have advantages of high picture quality, power saving, thin body, and wide applications, are widely used in mobile phones, televisions, personal digital assistants, digital cameras, notebook computers, desktop computers, and other consumer electronic products, and have become a mainstream in display devices.

In active liquid crystal displays, each sub-pixel has a thin film transistor (TFT), whose gate is connected to a horizontal scanning line, its drain is connected to a vertical data line, and its source is connected to a pixel electrode. Applying enough voltage on the horizontal scanning line will turn on all the TFTs on the horizontal scanning line. At this time, the pixel electrode on the horizontal scanning line will communicate with data lines in a vertical direction, thereby writing a display signal voltage on the data lines to a pixel, controlling transmittance of different liquid crystals to achieve performance of controlling color. At present, driving of horizontal scanning lines of an active liquid crystal display panel is mainly completed by an external chip (IC) of a panel. The external IC can control progressive charging and discharging of the horizontal scanning lines at various levels. Gate driver on array (GOA) technology is to use an existing thin film transistor liquid crystal display array manufacturing process to fabricate a gate line scan driving signal circuit on an array substrate to implement a progressive driving method for a gate.

Referring to FIG. 1, FIG. 1 is a diagram of a GOA circuit of the prior art, in which a Gn output node is connected to a transistor T21 and a transistor T31. For a GOA circuit to work normally, it needs an STV signal that controls turning on of a GOA and a clock signal (CLOCK, which is abbreviated as CK) for controlling a GOA output. At the same time, when the GOA is not working, a gate output needs to be pulled low to a VSSG potential. In order to better ensure a switching state of the TFT inside the GOA circuit, another low potential VGL potential is introduced.

Referring to FIG. 2, FIG. 2 is a schematic diagram of a node waveform during normal operation of the prior art. FIG. 2 shows a working waveform of a specific embodiment G3 of a node Gn. When a duty cycle of a clock signal is 40% or 60%, in a G3 pull-down stage, Q3 is still high, and Gn is pulled down to CKL (that is, VGL) through T21. When CK1 is high and G5 is high, T31 is turned on at this time. When the node Gn of a GOA output gate signal is pulled down to a low potential, one path is pulled down to TVSS through T31 and another path is pulled down to VGL through T21. Therefore, there is an equivalent resistance between the VGL and VSSG (on-state resistances R21 and R31 formed by the two TFTs T21 and T31 in the on-state), and the resistance value thereof is Requal=R31+R21. When Q3 is low, T21 is turned off, because the TFT has a large off-resistance, CKL and VSSG are equivalent to an open circuit. This is the case of a single stage, because GOA is turned on in stages, so from an outside of an LCD, there is always an equivalent resistance between CKL and VSSG.

Referring to FIG. 3, FIG. 3 is a diagram of a VSSG generation circuit of the prior art. A power management IC (PMIC) generates an IB current through a BJT transistor, so that the BJT transistor becomes a resistor with a resistance value of RBJT. In an initial design of a system board, it cannot be connected to an LCD to adjust the IB current. Usually, a system side sets a theoretical IB value by itself, which will output an ideal value of VSSG. Once it is subsequently connected to an LCD panel and there is a Requal, an amplification factor Av=[−β*(Rc□Requal)]/IB*Rbe. At this time, IB does not change, causing the amplification factor Av to become larger, causing VSSG to change, which may cause LCD abnormalities. Therefore, R90 and Cl voltage regulator RC circuits are usually added to a conventional system board. At this time, R90 is a fixed resistor. This can change the resistance after connecting the LCD to stabilize VSSG at a set value.

Referring to FIG. 4, FIG. 4 is a schematic diagram of a current-voltage change during a transistor aging process. After a transistor is aging, I-V drifts forward, and its output current Ioff will decrease, causing Ron resistance to increase, Ion to decrease, and Vds voltage does not change, so that a resistance of a TFT becomes larger, which makes a resistance of an equivalent resistor Requal larger. On a system board (C-Board), VSSG is a potential that divides VGL through a PMIC control. Therefore, Requal changes in its partial voltage will also change, resulting in changes in VSSG potential.

Therefore, a voltage stabilization circuit of a VSSG generation circuit in the prior art has defects, and a voltage stabilization circuit capable of solving issues of VSSG potential drift caused by transistor aging is needed.

SUMMARY OF THE INVENTION

An embodiment of the present invention provides a voltage stabilization circuit, a control method, and a display device, which solve issues of VSSG potential drift caused by transistor aging in the prior art.

In one aspect, an embodiment of the present application provides a voltage stabilization circuit comprising a first transistor, a second transistor, and a third transistor. A source of the first transistor is electrically connected to a drain of the second transistor and a gate of the third transistor, a drain of the first transistor is electrically connected to a first control output terminal of a power management integrated circuit, a gate of the first transistor is electrically connected to a second control output terminal of the power management integrated circuit, a gate of the second transistor is electrically connected to the second control output terminal of the power management integrated circuit, a drain of the third transistor is electrically connected to a first level terminal for connecting to a display panel, and the first level terminal is electrically connected to a third control output terminal of the power management integrated circuit through a triode.

In an embodiment of the present application, the first level terminal is further electrically connected to an end of a voltage stabilization capacitor.

In an embodiment of the present application, the first level terminal is further electrically connected to a feedback terminal of the power management integrated circuit, and when a voltage of the gate of the first transistor changes, a change signal is fed back to the feedback terminal of the power management integrated circuit through the first level terminal.

In an embodiment of the present application, a base of the triode is electrically connected to the third control output terminal of the power management integrated circuit, a collector of the triode is electrically connected to the first level terminal, and an emitter of the triode is electrically connected to a second level terminal.

In an embodiment of the present application, the first level terminal is further electrically connected to a feedback terminal of the power management integrated circuit, and when a voltage of the gate of the first transistor changes, a change signal is fed back to the feedback terminal of the power management integrated circuit through the first level terminal.

In an embodiment of the present application, the second level terminal is electrically connected to the display panel, and an equivalent resistance is formed in the display panel between the first level terminal and the second level terminal.

In an embodiment of the present application, the first level terminal is further electrically connected to a feedback terminal of the power management integrated circuit, and when a voltage of the gate of the first transistor changes, a change signal is fed back to the feedback terminal of the power management integrated circuit through the first level terminal.

In an embodiment of the present application, the first level terminal is electrically connected to the display panel through a level conversion circuit.

In an embodiment of the present application, the third transistor operates in a linear region.

In one aspect, an embodiment of the present application provides a method of controlling a voltage stabilization circuit, which is implemented by the above voltage stabilization circuit, comprising the power management integrated circuit configured to output a first voltage signal through the first control output terminal and a second voltage signal through the second control output terminal, respectively, where the first voltage signal is different from the second voltage signal. When a voltage of the gate of the first transistor changes, a change signal is fed back to the feedback terminal of the power management integrated circuit through the first level terminal, and the power management integrated circuit randomly adjusts the first voltage signal and the second voltage signal respectively according to the change signal.

In one aspect, an embodiment of the present application provides a display device comprising the above voltage stabilization circuit.

Beneficial effects of the present application are to solve issues of VSSG potential drift caused by transistor aging and further to ensure normal operation of the display panel.

BRIEF DESCRIPTION OF THE SEVERAL VIEWS OF THE DRAWINGS

The present invention will be further described below with reference to the accompanying drawings and embodiments. In the drawings.

DESCRIPTION OF SPECIFIC EMBODIMENTS OF THE INVENTION

In order to have a clearer understanding of the technical features, objects, and effects of the present invention, specific embodiments of the present invention will now be described in detail with reference to the drawings.

A voltage stabilization circuit provided by an embodiment of the present invention can be applied to a GOA (gate driver on array, line scan technology integrated on an array substrate), and is particularly suitable for a-siGOA (GOA of amorphous silicon thin film transistor) products in active liquid crystal displays (LCDs).

Figure 5:
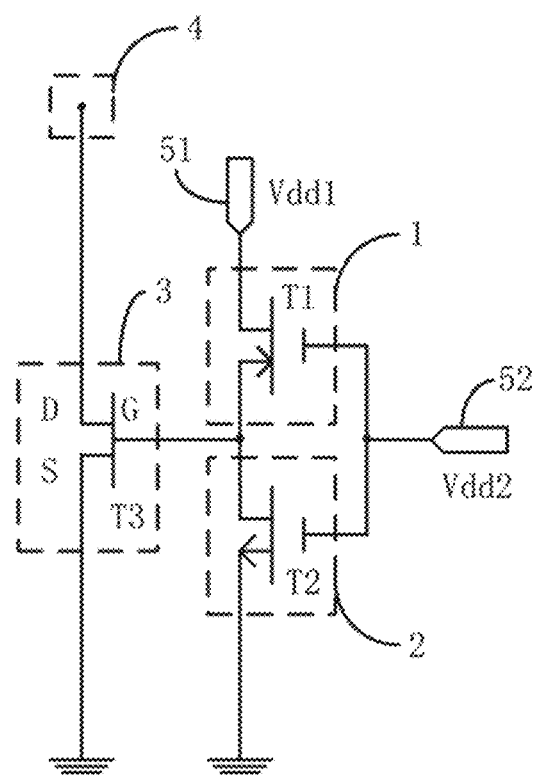
FIG. 5 is a diagram of a voltage stabilization circuit provided by an embodiment of the present invention.

Referring to FIG. 5, FIG. 5 is a diagram of a voltage stabilization circuit provided by an embodiment of the present invention. The voltage stabilization circuit comprises a first transistor 1, a second transistor 2, and a third transistor 3. A source of the first transistor 1 is electrically connected to a drain of the second transistor 2 and a gate of the third transistor 3, a drain of the first transistor 1 is electrically connected to a first control output terminal 51 of a power management integrated circuit (PMIC) 5, a gate of the first transistor 1 is electrically connected to a second control output terminal 52 of the power management integrated circuit 5, a gate of the second transistor 2 is electrically connected to the second control output terminal 52 of the power management integrated circuit 5, a drain of the third transistor 3 is electrically connected to a first level terminal 4 for connecting to a display panel 10. Preferably, the first transistor 1, the second transistor 2, and the third transistor 3 are field effect transistors, and the display panel 10 is an LCD panel.

Figure 6:
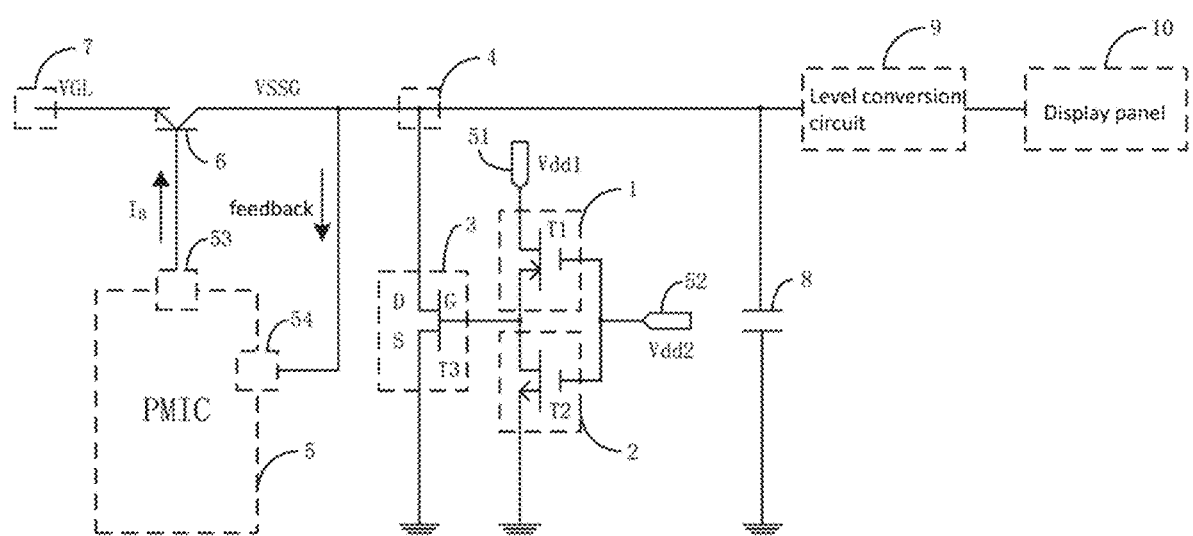
FIG. 6 is a diagram of a VSSG generation circuit provided by an embodiment of the present invention.

The voltage stabilization circuit of an embodiment of the present invention is applied to a VSSG generation circuit as shown in FIG. 6. FIG. 6 is a diagram of a VSSG generation circuit provided by an embodiment of the present invention. The first level terminal 4 is further electrically connected to an end of a voltage stabilization capacitor 8. The first level terminal 4 is electrically connected to a third control output terminal 53 of the power management integrated circuit 5 through a triode 6. In an embodiment of the present application, a base of the triode 6 is electrically connected to the third control output terminal 53 of the power management integrated circuit 5, a collector of the triode 6 is electrically connected to the first level terminal 4, and an emitter of the triode 6 is electrically connected to a second level terminal 7.

The second level terminal 7 is electrically connected to the display panel 10, and an equivalent resistance is formed in the display panel 10 between the first level terminal 4 and the second level terminal 7. This equivalent resistance is the equivalent resistance in the background technology, and its resistance value is Requal=R31+R21.

In FIG. 6, the first level terminal 4 is further electrically connected to a feedback terminal 54 of the power management integrated circuit 5, and when a voltage of the gate of the first transistor 1 changes, a change signal is fed back to the feedback terminal 54 of the power management integrated circuit 5 through the first level terminal 4. The first level terminal 4 is electrically connected to the display panel 10 through a level conversion circuit 9.

By adjusting device sizes, channel lengths, and their proportional relationship of the first transistor 1 and the second transistor 2, a gate voltage of the third transistor 3 is guaranteed to be within a certain range, so that the third transistor 3 operates in a linear region.

An embodiment of the present invention also provides a control method of a voltage stabilization circuit, which is implemented by using the voltage stabilization circuit as described above and is also implemented by embedding a program in the power management integrated circuit 5. The control method includes steps S1 and S2.

Figure 1:
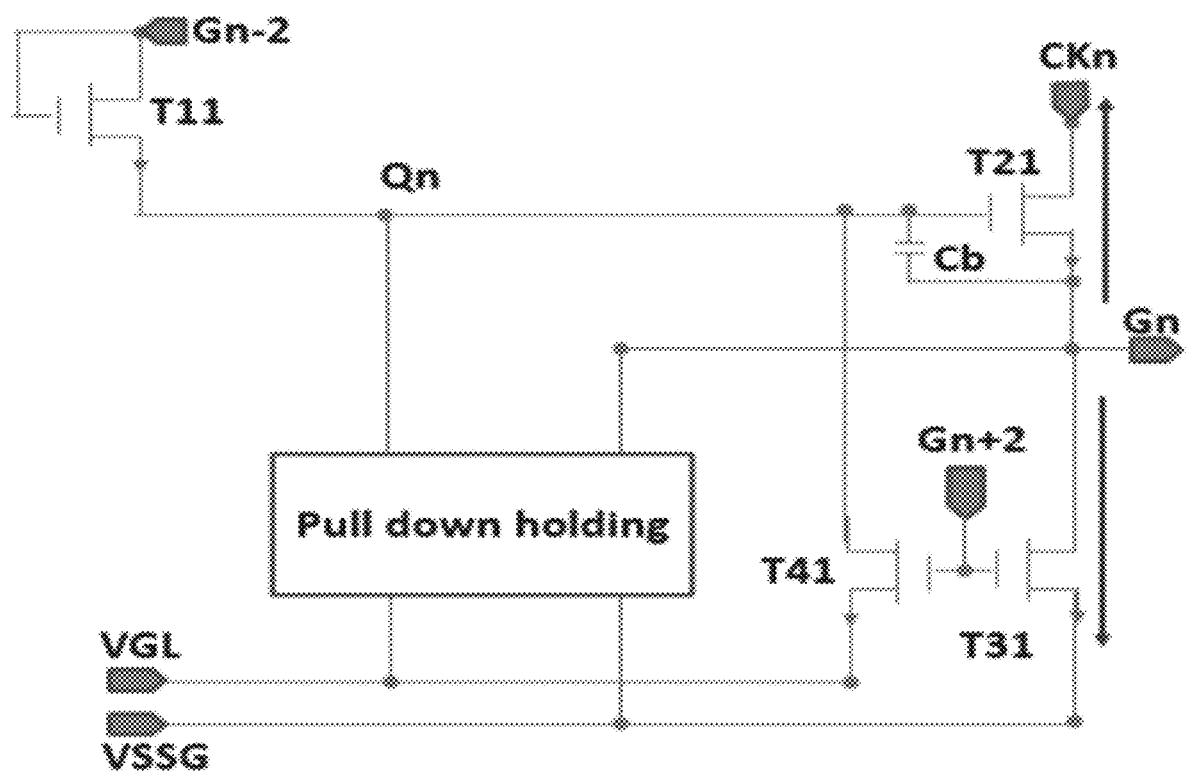
FIG. 1 is a diagram of a GOA circuit of the prior art.
Figure 2:
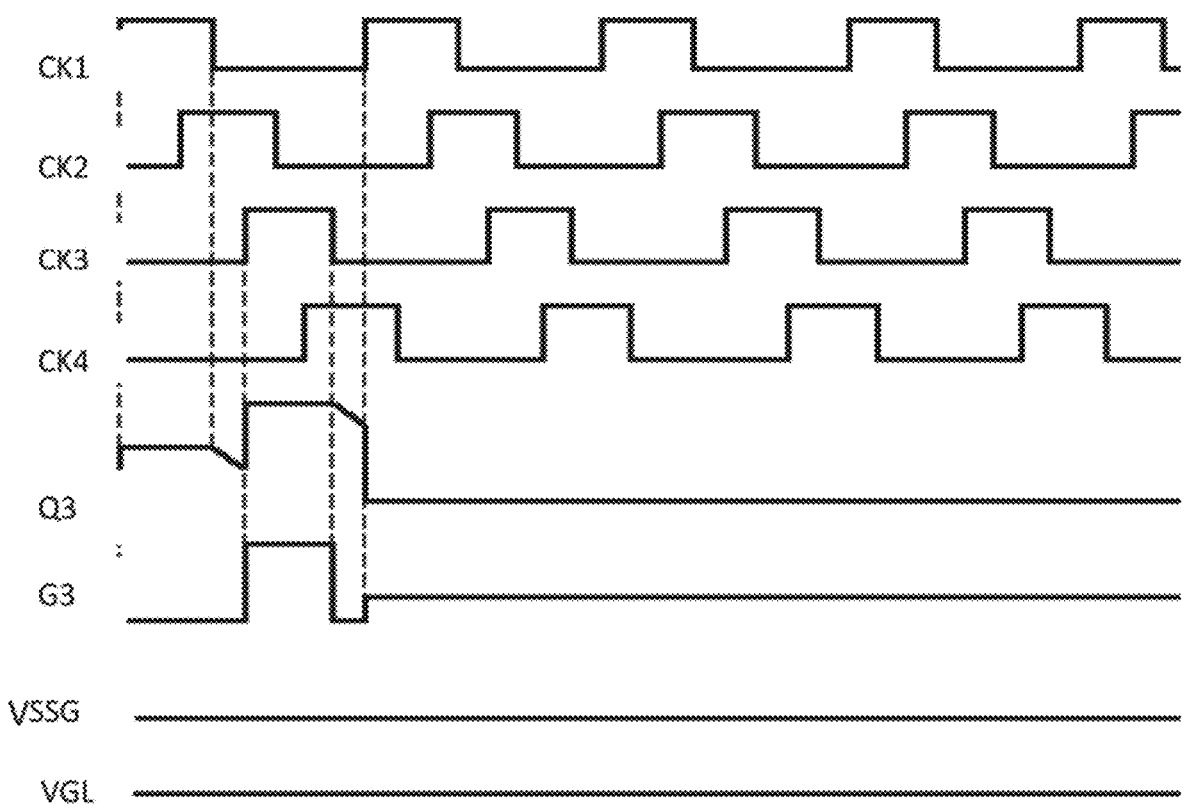
FIG. 2 is a schematic diagram of a node waveform during normal operation of the prior art.
Figure 3:
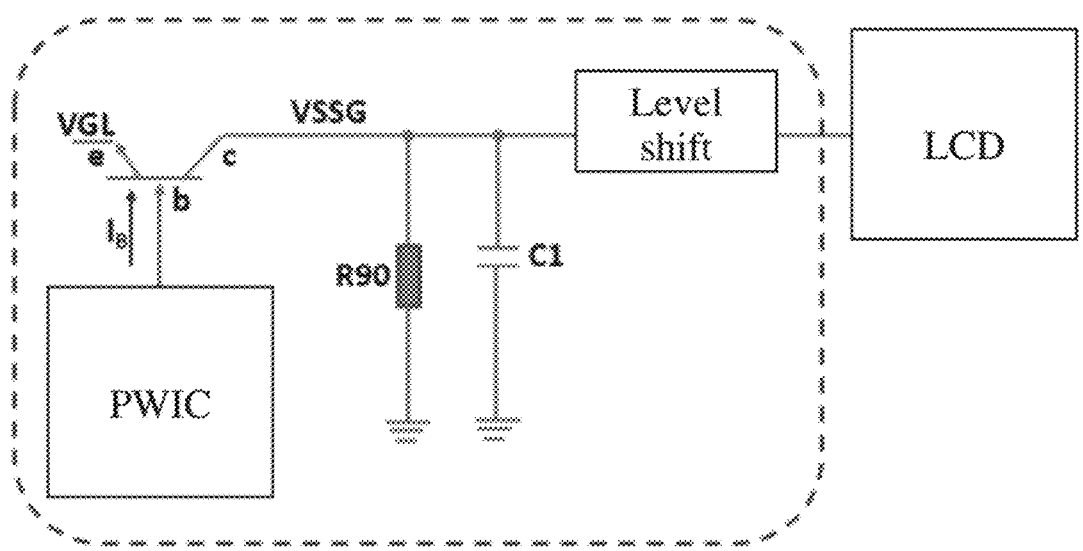
FIG. 3 is a diagram of a VSSG generation circuit of the prior art.
Figure 4:
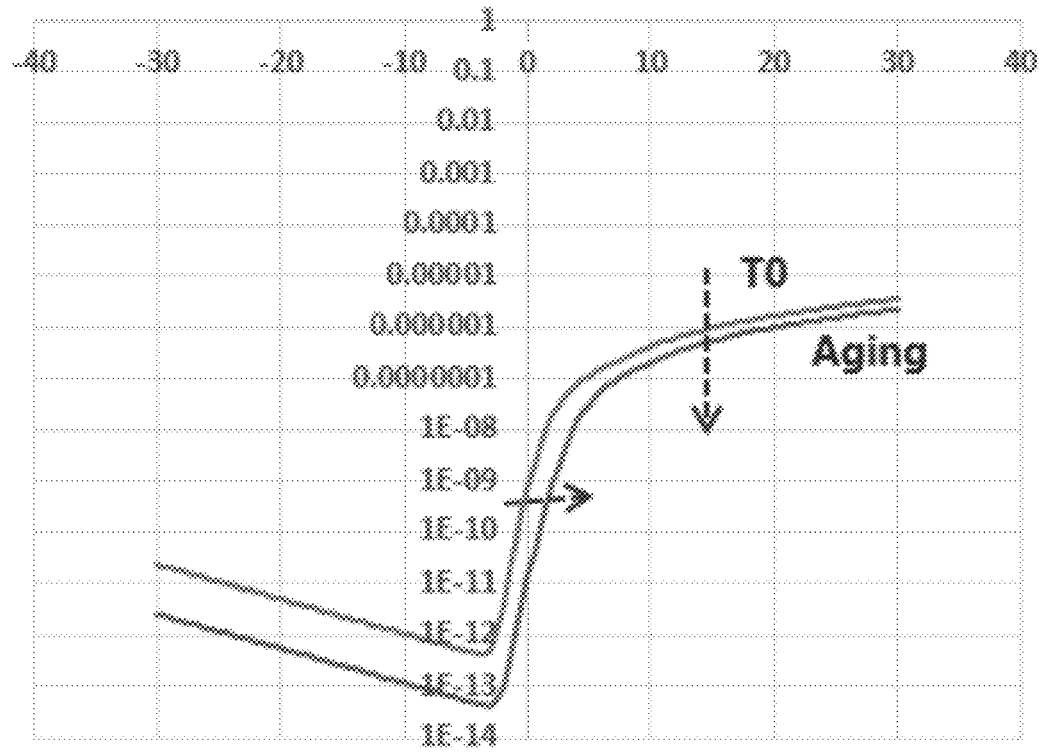
FIG. 4 is a schematic diagram of a current-voltage change during a transistor aging process.

S1, the power management integrated circuit 5 configured to output a first voltage signal through the first control output terminal 51 and a second voltage signal through the second control output terminal 52, respectively, where the first voltage signal is different from the second voltage signal. That is, R90 shown in FIG. 3 is replaced with a voltage stabilization circuit composed of three transistors (T1, T2, T3), wherein Vdd1 and Vdd2 are two different high potentials controlled by the PMIC. S2, when a voltage of the gate of the first transistor 1 changes, a change signal is fed back to the feedback terminal 54 of the power management integrated circuit 5 through the first level terminal 4, and the power management integrated circuit 5 randomly adjusts the first voltage signal and the second voltage signal respectively according to the change signal. That is, when the voltage of the gate of the first transistor 1 changes, the PMIC receives a feedback signal and randomly adjusts the voltages of Vdd1 and Vdd2 to change voltage division states of the first transistor 1 and the second transistor 2, so that the voltage of the gate of the third transistor 3 changes, and the equivalent resistance between the drain and the source of the third transistor 3 changes accordingly, and the purpose of adjusting the VSSG voltage can be achieved.

Further, an embodiment of the present application provides a display device comprising the above voltage stabilization circuit.

The embodiments of the present invention have been described above with reference to the accompanying drawings, but the present invention is not limited to the above specific implementations. The specific embodiments described above are merely illustrative and not restrictive. A person of ordinary skill in the art may, under the inspiration of the present invention, make many forms without departing from the spirit of the present invention and the scope of protection of the claims, which all fall within the protection of the present invention.

What is claimed is:

1. A voltage stabilization circuit, comprising:
a first transistor, a second transistor, and a third transistor;
wherein a source of the first transistor is electrically connected to a drain of the second transistor and a gate of the third transistor, a drain of the first transistor is electrically connected to a first control output terminal of a power management integrated circuit, a gate of the first transistor is electrically connected to a second control output terminal of the power management integrated circuit, a gate of the second transistor is electrically connected to the second control output terminal of the power management integrated circuit, a drain of the third transistor is electrically connected to a first level terminal for connecting to a display panel, and the first level terminal is electrically connected to a third control output terminal of the power management integrated circuit through a triode;
wherein a base of the triode is electrically connected to the third control output terminal of the power management integrated circuit, a collector of the triode is electrically connected to the first level terminal, and an emitter of the triode is electrically connected to a second level terminal; and
wherein the second level terminal is electrically connected to the display panel, and an equivalent resistance is formed in the display panel between the first level terminal and the second level terminal.

2. The voltage stabilization circuit according to claim 1, wherein the first level terminal is further electrically connected to an end of a voltage stabilization capacitor.

3. The voltage stabilization circuit according to claim 1, wherein the first level terminal is further electrically connected to a feedback terminal of the power management integrated circuit, and when a voltage of the gate of the first transistor changes, a change signal is fed back to the feedback terminal of the power management integrated circuit through the first level terminal.

4. The voltage stabilization circuit according to claim 1, wherein the first level terminal is further electrically connected to a feedback terminal of the power management integrated circuit, and when a voltage of the gate of the first transistor changes, a change signal is fed back to the feedback terminal of the power management integrated circuit through the first level terminal.

5. The voltage stabilization circuit according to claim 1, wherein the first level terminal is further electrically connected to a feedback terminal of the power management integrated circuit, and when a voltage of the gate of the first transistor changes, a change signal is fed back to the feedback terminal of the power management integrated circuit through the first level terminal.

6. The voltage stabilization circuit according to claim 1, wherein the first level terminal is electrically connected to the display panel through a level conversion circuit.

7. The voltage stabilization circuit according to claim 1, wherein the third transistor operates in a linear region.

8. A method of controlling a voltage stabilization circuit, which is implemented by the voltage stabilization circuit according to claim 1, comprising:
the power management integrated circuit configured to output a first voltage signal through the first control output terminal and a second voltage signal through the second control output terminal, respectively, where the first voltage signal is different from the second voltage signal;
wherein when a voltage of the gate of the first transistor changes, a change signal is fed back to the feedback terminal of the power management integrated circuit through the first level terminal, and the power management integrated circuit randomly adjusts the first voltage signal and the second voltage signal respectively according to the change signal.

9. A display device comprising the voltage stabilization circuit according to claim 1.

* * * * *